United States Patent
Fuselier et al.

(10) Patent No.: US 6,794,256 B1
(45) Date of Patent: Sep. 21, 2004

(54) METHOD FOR ASYMMETRIC SPACER FORMATION

(75) Inventors: Mark B. Fuselier, Austin, TX (US); Edward E. Ehrichs, Austin, TX (US); S. Doug Ray, Austin, TX (US); Chad Weintraub, Dresden (DE); James F. Buller, Austin, TX (US)

(73) Assignee: Advanced Micro Devices Inc., Sunnyvale, CA (US)

( * ) Notice: Subject to any disclaimer, the term of this patent is extended or adjusted under 35 U.S.C. 154(b) by 0 days.

(21) Appl. No.: 10/633,981

(22) Filed: Aug. 4, 2003

(51) Int. Cl.[7] .............................................. H01L 21/336
(52) U.S. Cl. ...................... 438/286; 438/302; 438/303; 438/305
(58) Field of Search ................................. 438/286, 302, 438/303, 305, 179, 283, 586, 592

(56) References Cited

U.S. PATENT DOCUMENTS

| | | | | |
|---|---|---|---|---|
| 5,510,280 A | * | 4/1996 | Noda ........................... | 438/179 |
| 5,639,688 A | * | 6/1997 | Delgado et al. ............ | 438/586 |
| 5,789,298 A | * | 8/1998 | Gardner et al. ............. | 438/286 |
| 5,893,739 A | * | 4/1999 | Kadosh et al. .............. | 438/286 |
| 5,963,809 A | * | 10/1999 | Duane et al. ................ | 438/286 |
| 6,104,064 A | * | 8/2000 | Kadosh et al. .............. | 257/344 |
| 6,200,863 B1 | * | 3/2001 | Xiang et al. ................. | 438/286 |
| 6,218,250 B1 | * | 4/2001 | Hause et al. ................ | 438/302 |
| 6,403,425 B1 | * | 6/2002 | Ang et al. ................... | 438/283 |
| 6,566,204 B1 | * | 5/2003 | Wang et al. ................. | 438/286 |

* cited by examiner

*Primary Examiner*—Ha Tran Nguyen
*Assistant Examiner*—Walter L. Lindsay, Jr.
(74) *Attorney, Agent, or Firm*—Toler, Larson & Abel, LLP

(57) ABSTRACT

A method for asymmetric spacer formation integratable into a manufacturing process for integrated circuit semiconductor devices is presented. The method comprises forming a gate structure over a substrate, and forming a sidewall layer overlying the gate structure and substrate, wherein the sidewall layer comprises a first portion overlying a first sidewall of the gate structure. A photoresist structure is formed adjacent to the first portion, and subjected to an ion beam. The photoresist structure serves to shield at least part of the first portion from the ion beam. During irradiation, the wafer is oriented such that a non-orthogonal tilt angle exists between a path of the ion beam and a surface of the first sidewall. Formation of asymmetric spacers is possible because radiation damage to unshielded sidewall portions permits subsequent etches to proceed at a faster rate.

29 Claims, 6 Drawing Sheets

METHOD FOR ASYMMETRIC SPACER FORMATION

FIELD OF THE DISCLOSURE

The present disclosure relates generally to a semiconductor manufacturing process, and more particularly to a method for formation of spacers in a semiconductor manufacturing process.

BACKGROUND

Asymmetric spacers are used for various functions during semiconductor device manufacturing. For example, if differential offsets are needed for disparate doping requirements of source or drain areas near a gate structure, oftentimes asymmetric spacers are utilized to accomplish this offset. A commonly employed technique for the formation of asymmetric spacers utilizes multiple gate structure sidewall insulator layers and multiple implantations with numerous photoresist masking and etching processes to produce the desired offset. This technique is time-consuming, and the multiple masking and etching steps add to the manufacturing costs accordingly.

Therefore, a method which overcomes these problems would be useful.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements for clarity. Other advantages, features and characteristics of the present disclosure, as well as methods, operation and functions of related elements of structure, and the combinations of parts and economies of manufacture, will become apparent upon consideration of the following description and claims with reference to the accompanying drawings, all of which form a part of the specification, wherein like reference numerals designate corresponding parts in the various figures, and wherein:

DETAILED DESCRIPTION OF THE FIGURES

The present disclosure provides a method for asymmetric spacer formation appropriate for integration into a manufacturing process for integrated circuit semiconductor devices, as well as an apparatus created according to the teachings disclosed herein. The method comprises the steps of forming a gate structure over a semiconductor substrate, and forming a sidewall layer overlying the gate structure and substrate, wherein the sidewall layer comprises a first portion overlying a first sidewall of the gate structure. A photoresist structure is then formed adjacent to the first portion, and subjected to an ion beam. The photoresist structure serves to shield at least part of the first portion of the sidewall from the ion beam. During ion beam irradiation, the wafer is oriented such that a non-orthogonal tilt angle exists between a path of the ion beam and a surface of the first sidewall. In an embodiment, the method enables the formation of asymmetric spacers because radiation damage to unshielded sidewall portions permits subsequent etches to proceed at a faster rate. In another embodiment, radiation hardening can be used to create asymmetric spacers. The methods disclosed result in time savings over conventional processes to create asymmetrical spacers for source/drain extension offsets.

FIGS. 1 through 8 illustrate, in cross-section, semiconductor device manufacturing process steps according to embodiments of the present disclosure. At the manufacturing stage presented in FIG. 1, gate structure 15, and sidewall layer 10 have been formed over the substrate 12. The gate structure 15 can include various layers and/or components such as a gate oxide layer. Semiconductor substrate 12 can be a mono-crystalline silicon substrate. Alternatively, substrate 12 can also be a gallium arsenide substrate, a silicon-on-insulator substrate, a silicon on sapphire substrate, or the like. Gate structure 15 is generally poly-crystalline or amorphous silicon having a width that can vary by application and/or process. Sidewall layer 10 can include a film stack which can comprise a silicon oxide such as $SiO_2$, a nitride layer such as silicon nitride, or SiON, and may be formed by deposition techniques known in the art, e.g., PECVD, LPCVD and the like. The thickness of sidewall layer 10 typically ranges from 80 to 250 Angstroms, but may vary depending on process technology. At a later point during the manufacturing process, portions of sidewall layer 10 will serve as gate structure 15 sidewall spacers during source/drain (S/D) extension implantation.

Figure 1:
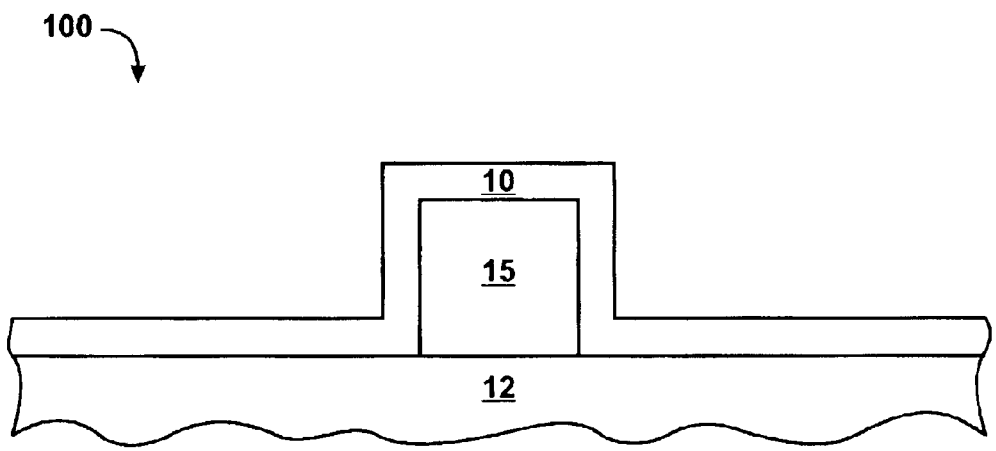
FIGS. 1 through 10 illustrate, in cross-section, semiconductor device manufacturing process steps according to at least one embodiment of the present disclosure.
Figure 2:
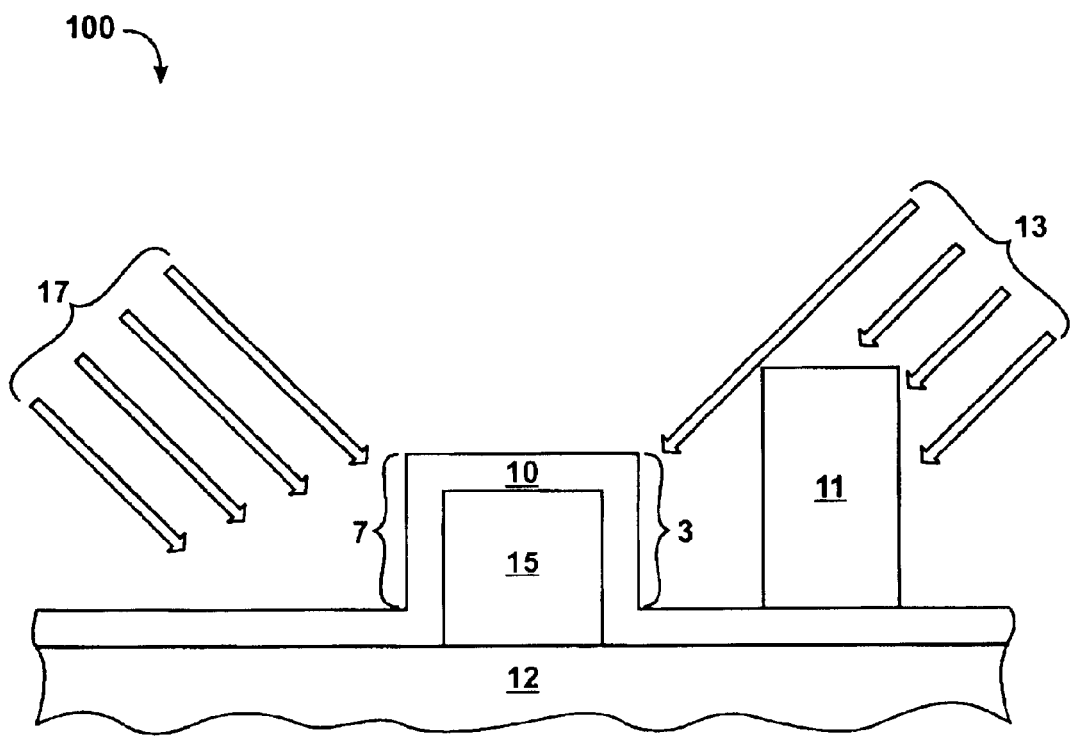
Figure 5:
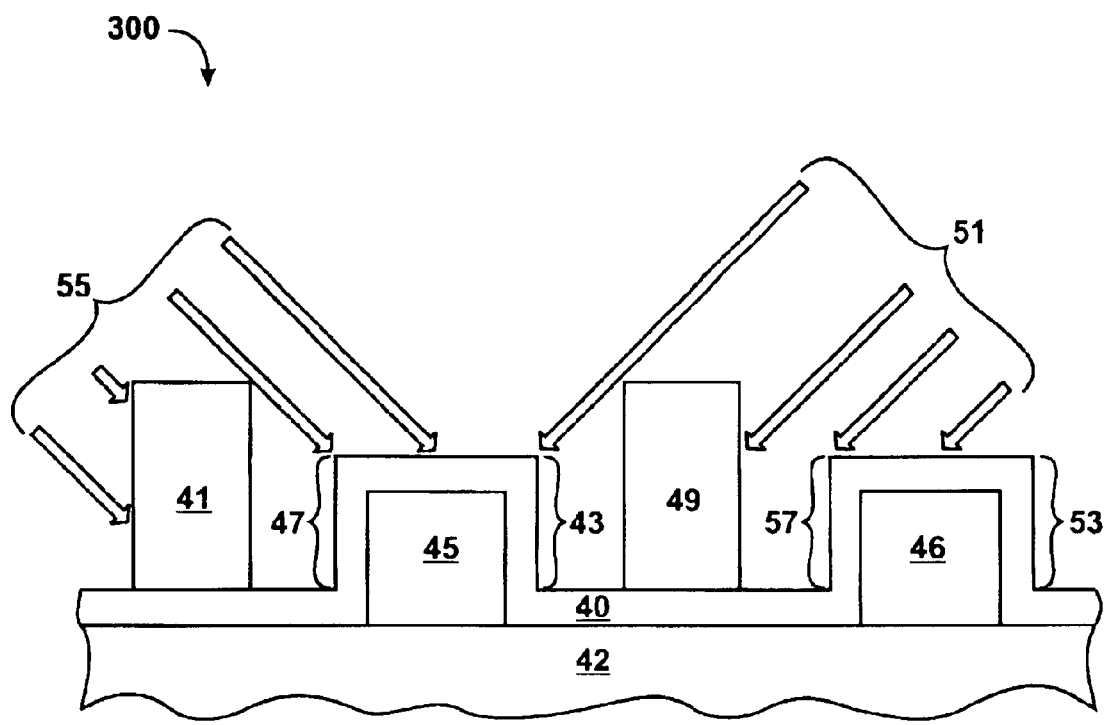

FIG. 2 illustrates in cross-section, portion 100 of the semiconductor device of FIG. 1 following formation of an ion beam blocking structure 11 that may be a photoresist structure 11. The placement of the photoresist structure 11 is determined during the design stage (prior to manufacturing), when it is determined which gate structures require asymmetric sidewalls. That is, it is determined which devices should be shielded from ion bombardment, and the placement of photoresist structures such as photoresist structure 11 are planned accordingly. For example, if symmetrical sidewalls are desired, 'shielding' photoresist structures could be placed on either side of gate structure 15, as shown in FIG. 5. Alternately, symmetrical sidewalls can be created by applying a photoresist mask completely overlying gate structure 15 (not shown), as in conventional processing. There is also the option of not shielding either side of gate structure 15 resulting in symmetrical thin sidewalls. Combinations of the conventional techniques and the present method could also be utilized as needed.

After deposition and development of photoresist structure 11, portion 100 will be subjected to irradiation by ion beams 13 and 17 of FIG. 2. During irradiation, a sidewall portion 3 of sidewall layer 10 will be oriented to have a non-orthogonal tilt angle between the path of the ion beam 13 and a surface of the sidewall portion 3, or ion beam 17 and a sidewall portion 7. In an embodiment, the non-orthogonal tilt angle has an angle of incidence formed by the path of the ion beam 13 and 17 and the surface of sidewall portion 3 or sidewall portion 7 ranging between 7 degrees and 45 degrees. Selection of the non-orthogonal tilt angle is based upon the thickness of the sidewall layer (film stack 10) and the height of the gate structure 15, as well as the height of photoresist structure 11. It should be noted that irradiation by ion beam 13 and ion beam 17 typically occurs using the same ion beam equipment at specific times, e.g., ion beam 13 has identical characteristics to ion beam 17 as they are the same ion beam, only the orientation/tilt angle of portion 100 changes during ion beam irradiation and/or implantation.

The ion beam 13, 17 dose delivered ranges from between $10^{12}$ to $10^{15}$ $cm^{-2}$. In an embodiment, the ion beam 13, 17 comprises a species of an element with an atomic number greater than nine, e.g., germanium (Ge) or silicon (Si).

As seen in FIG. 2, the photoresist structure 11 provides shielding from ion beam 13 for sidewall portion 3, while sidewall portion 7, which is the opposing sidewall to sidewall portion 7, has no corresponding shielding structure from ion beam 17, and is therefore subjected to a 'full strength' ion beam 17. This produces radiation damage effects to sidewall portion 7. This radiation damage modifies the characteristics of sidewall portion 7 such that during the etch process which follows ion bombardment, sidewall portion 7 will etch at a greater rate than the shielded sidewall portion 3, as seen in FIG. 3.

Figure 3:
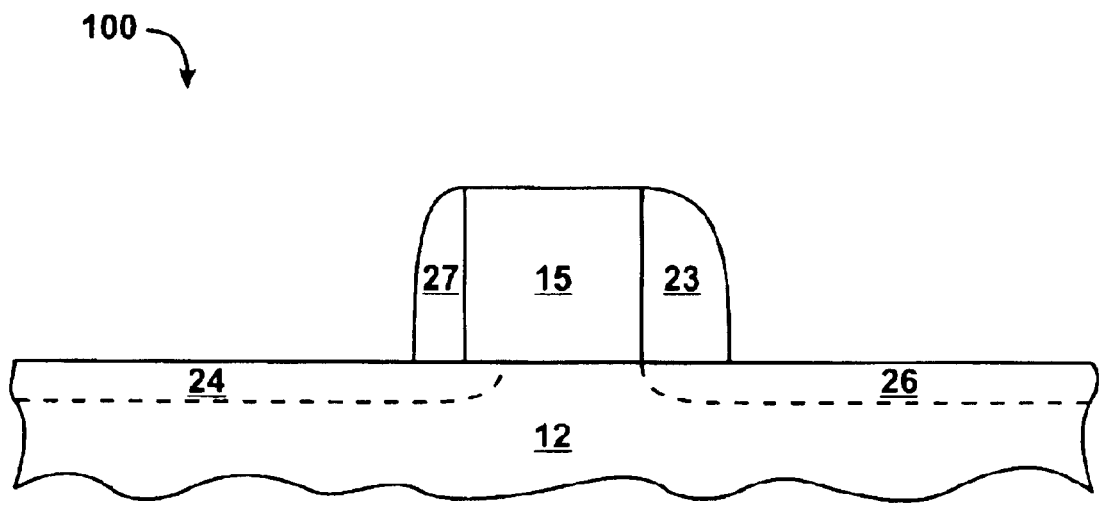

FIG. 3 illustrates in cross-section, portion 100 of the semiconductor device of FIG. 2 following photoresist strip and source/drain extension formation. Typically, the etch process used to form the sidewalls 27 and 23 is an anisotropic dry etch chemistry of CF4/CHF3/Ar with a reactive ion etch process at a power of greater than 100 Watts, and using an end-pointing technique.

Because of the aforementioned radiation damage to sidewall portion 7 as discussed above, the resultant spacer 27 has less thickness than the spacer 23, which was protected by the photoresist structure 11. That is, the result is asymmetric sidewall spacers 27 and 23. A thickness for thick spacer 27 is typically in the range of 20–200 angstroms, and the thickness for thick spacer 23 is typically in the range of 60–200 angstroms. After the creation of the sidewall spacers 23 and 27, portion 100 is ready to undergo source/drain extension implantation which creates source drain extension regions 24 and 26.

Due to the difference in thickness between spacer 27 and spacer 23, the source side extension region 24 will underlie, or be closer to, the gate structure 15 by an amount greater than the drain side extension region 26. Thus the drain side extension region 26 does not overlap the gate by as much as the source side extension region 24. If a source side extension is not sufficiently overlapped with the gate, then source side channel barrier control is degraded, adversely affecting device performance. The present disclosure offers the advantage of avoiding the occurrence of this undesirable condition. In addition, the disclosure allows for decoupled optimization of the source side and drain side spacer thicknesses. For submicron transistor architectures, a low overlap of gate and drain is desired to reduce the "miller" capacitance between input (gate) and output (drain) terminals. However, a sufficient overlap of gate and source is required for best transistor drive. Currently used symmetric spacers are limited in that the choice of overlap for the drain and source must be a single decision based on tradeoff/optimization of lower "miller" capacitance and higher transistor drive. This disclosure allows for the realization/optimization of these parameters independently.

Figure 4:
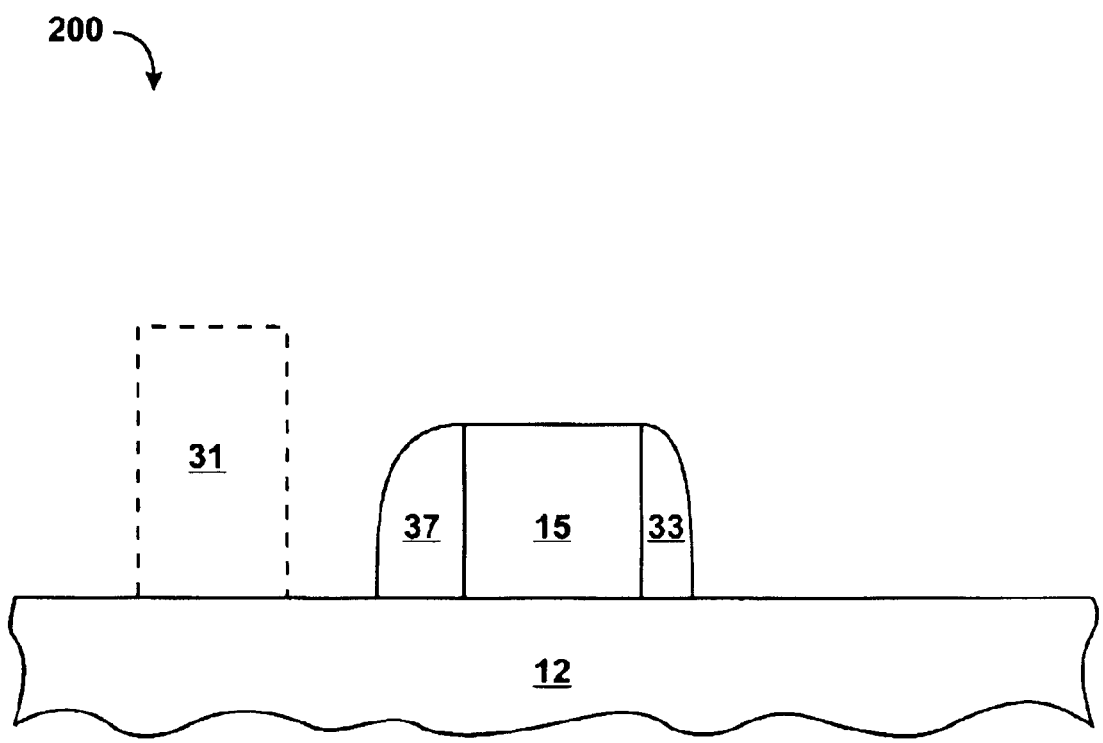

The method offers flexibility as to the location of spacer asymmetry, as seen in FIG. 4. FIG. 4 illustrates, in cross-section, a portion 200 of a semiconductor device in which the photoresist structure and non-orthogonal ion beam exposure have been conducted, and photoresist strip and etching have taken place. In the example illustrated in FIG. 4, a photoresist structure 31 was formed in a different location from that of the photoresist structure 11 of FIGS. 1–3 to create the structure illustrated. Hence, in FIG. 4, the thicker spacer 37 is opposite that shown in FIG. 3. Because stripping and etch have already occurred, photoresist structure 31 is shown as a dashed-line box in FIG. 4 to denote where the photoresist structure 31 would have been located during ion beam irradiation. That is, the principal difference between the embodiment illustrated in FIG. 3 and the embodiment illustrated in FIG. 4 is the location of the photoresist structure 31.

In an embodiment, the method permits the formation of symmetric as well as asymmetric spacers, as seen in FIG. 5. FIG. 5 illustrates, in cross-section, a portion 300 of a semiconductor device during a manufacturing stage according to the present disclosure. In FIG. 5, a first gate structure 45 with opposing sidewalls 43 and 47, and a second gate structure 46 with opposing sidewalls 53 and 57, are formed over a substrate 42. The respective opposing sidewalls 43 and 47 of the first gate structure 45 are parallel to each other, as is also the case for the respective opposing sidewalls 53 and 57 of the second gate structure 46. Following formation of the gate structures 45 and 46, a film stack 40 is formed overlying the gate structures 45 and 46 and their respective sidewalls.

As previously discussed, the placement of the photoresist structures is determined during the design planning stage (prior to manufacturing), when it is determined which gate structures require asymmetric sidewalls, and which require symmetric sidewalls. In the example of FIG. 5, photoresist mask 41 and photoresist mask 49 have been formed in the locations indicated according to this planning. Photoresist structure 41 serves to shield sidewall portion 47 during ion beam irradiation, while photoresist structure 42 serves to shield sidewall portions 43 and 57 during irradiation by ion beams 51 and 55.

Because opposing sidewall portions 47, 43, and 57 are shielded, they are not subjected to an ion dose during irradiation. During irradiation, a substantially horizontal surface, relative to the substrate 42, of gate structures 46 and 45 are oriented such that a non-orthogonal angle of incidence exists between a path of an ion beam 51, 55 and the substantially horizontal surfaces of the gate structures 45 and 46. While so oriented, sidewall portion 53 of film stack 40 is not shielded, thus it is subjected to a greater ion dose, and is radiation damaged. In an embodiment, the non-orthogonal angle of incidence ranges between 7 and 45 degrees, and is based upon the thickness of the film stack 40 and a vertical dimension (height) of photoresist structures 41 and 49. As before, it should be noted that irradiation by ion beam 51 and ion beam 55 typically occurs using the same ion beam equipment, though not necessarily at the same times, e.g., ion beam 51 has identical characteristics to ion beam 55 as they are generated by the same ion beam equipment. The orientation/tilt angle of portion 300 changes during irradiation and/or implantation. It should also be noted that more than one mask and etch step as taught herein can be employed to meet a certain design parameter, if desired, such as is presented in the examples of FIGS. 7 and 8.

Figure 6:
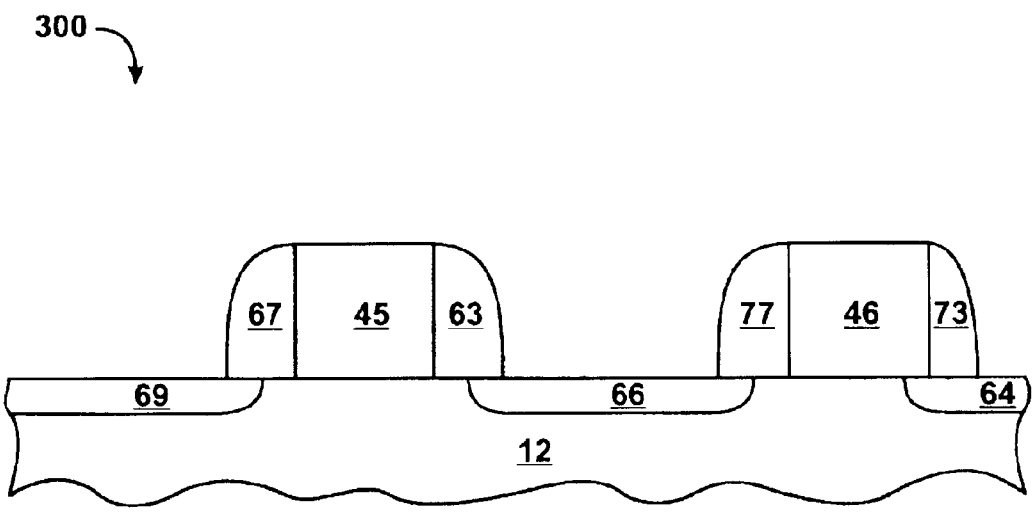

After delivery of the ion dose, which typically ranges from between $10^{12}$ to $10^{15}$ $cm^{-2}$, the photoresist structures 41 and 49 are stripped away, and portion 300 is subjected to an anisotropic etching process. The radiation damaged sidewall portion 53 will etch away at a faster rate than the protected sidewall portion 57, and the protected sidewall portions 47 and 43. This results in the formation of an asymmetric spacer 73 on gate structure 46, as shown in FIG. 6. Spacer 77 on gate structure 46 has greater thickness than spacers 73 and 77. Accordingly, because sidewall portions 43 and 47 of gate structure 45 were protected by photoresist structures 49 and 41, after etching, symmetric sidewalls 63 and 67 are present on gate structure 45.

Following the anisotropic etch process, a dopant is implanted to form a source side extension area 64 adjoining gate structure 46 sidewall 73. This implantation forms drain extension areas 66 and 69 adjoining gate structure 46 sidewall 77, as well as adjoining gate structure 45 sidewalls 63 and 67. Due to the asymmetric nature of the sidewalls for gate structure 46, the source area 64 underlies the gate structure 46 by an amount greater than the drain area 66. Because of the placement of photoresist structure 49 during the previous substantially non-orthogonal ion beam exposure, a common drain is created between gate structure 46 and 45. In a similar fashion, common source areas can be created between gates, as seen in FIG. 7.

Figure 7:
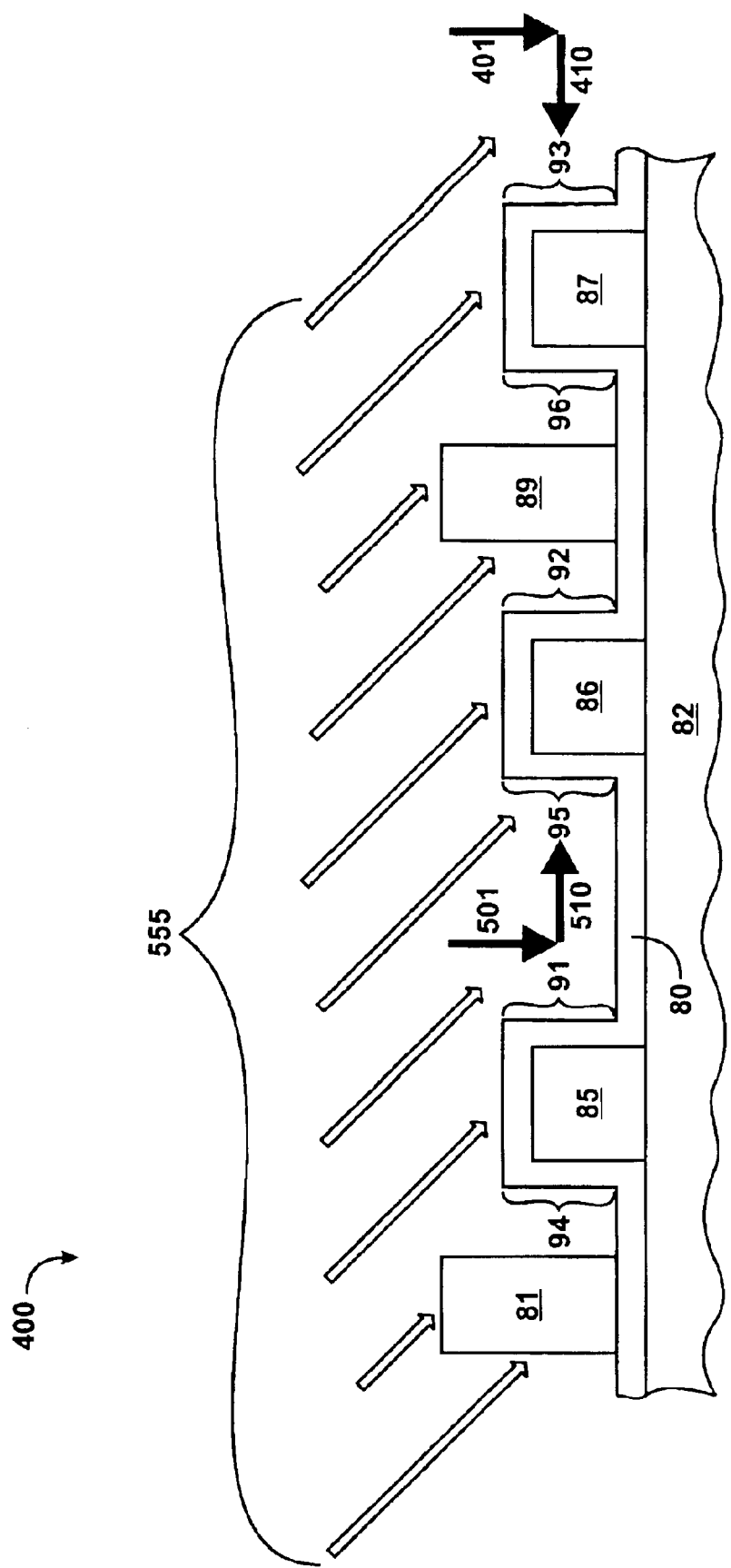

FIG. 7 illustrates, in cross section, a portion 400 of a semiconductor device manufactured according to an embodiment of the present disclosure. At the manufacturing stage presented in the example of FIG. 7, a plurality of gate structures 85, 86, and 87 have been formed overlying a substrate 82. Each of the plurality of gate structures 85–87 has opposing sidewalls facing a first direction, denoted by 91, 92, and 93, and facing a second direction, denoted by 94, 95, and 96. The first direction and the second direction are approximately opposite directions. A spacer layer 80 is formed over the plurality of gate structures 85–87 and their respective opposing sidewalls 91–93 and 94–96.

Following formation of spacer layer 80, portion 400 has various photoresist structures such as 81 and 89 formed. The placement of photoresist structures 81 and 89 is determined in a planning stage prior to undertaking manufacturing, as previously discussed. It should be noted that the placement of the photoresist structures 81 and 89 of FIG. 7 represent only one example of possible placement locations for photoresist structures. The operational requirements of the device ultimately determine photoresist mask design, and thus placement location. More than one mask, ion irradiation and etch step utilizing the present method may be required to meet the operational requirements of some devices.

Once photoresist structures 81 and 89 have been formed, portion 400 will be subjected to an ion dose. Prior to commencing ion dosing, portion 400 is adjusted such that a tilt exists between ion beam 555 paths and the plurality of gate structures 85–87. Due to geometrical considerations, ion beam paths comprise two directional components. For example, ion beams 555 have a first directional component 501, and a second directional component 510, denoted by the solid arrows 501 and 510 in FIG. 7. In the example of FIG. 7, the placement of photoresist structures 81 and 89 results in the gate structure 86 sidewall 95 receiving an unshielded ion dose from ion beams 555. The intervening photoresist structure 81 shields sidewall 94, and photoresist structure 89 shields sidewall 96 of gate structure 87 during ion beams 555 irradiation.

In the particular design scheme example illustrated in FIG. 7, the number of unshielded sidewalls of a gate structure, i.e., 95 is less than the number of shielded sidewalls of a gate structure, i.e., 94 and 96. In the various embodiments of the present disclosure, placement of photoresist structures such as photoresist structures 81 and 89 is one factor which determines the asymmetry or symmetry of gate structure sidewalls. The subsequent source/drain extension doping can result in common source extensions, common drain extensions, or separate source and drain extensions, dependent upon the design layout for placement of photoresist structures.

Figure 8:
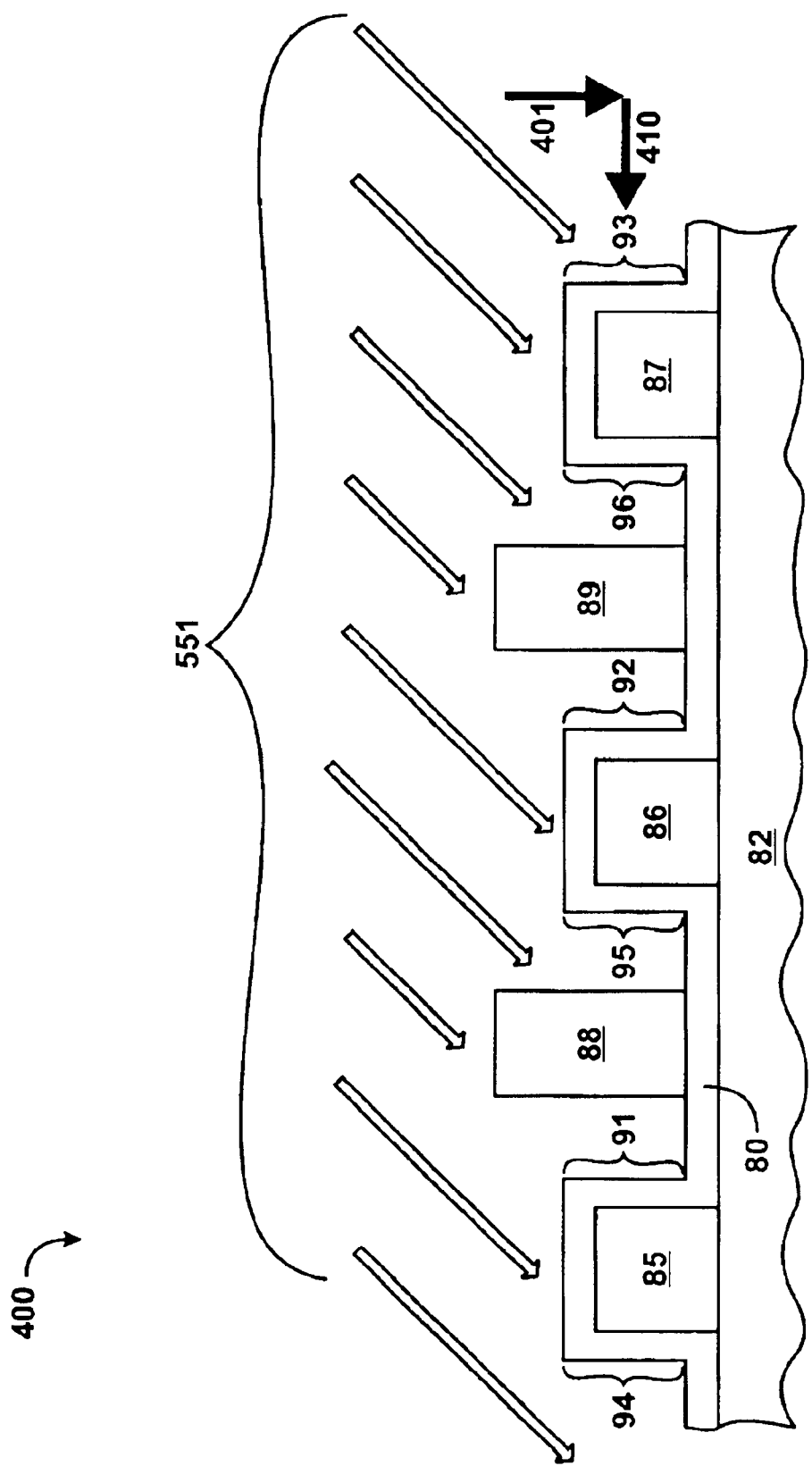

FIG. 8 illustrates, in cross section, the portion 400 of a semiconductor device manufactured according to an embodiment of the present disclosure. At the manufacturing step following that of FIG. 7. In FIG. 8, resist mask 81 has been removed, and resist mask 88 added. Note that resist mask 89 is illustrated to remain, however, typically, all resist masks illustrated in FIG. 7 will be removed, and new masks added. Therefore, mask 89 in FIG. 8 is typically a different mask in FIG. 8 that occupies the same location as mask 89 in FIG. 7. The additional photoresist mask structures 88 has been formed adjacent to plurality of gate structures 86 and 87, while photoresist structure 81 has been removed. An ion dose follows orientation of portion 400 such that a tilt exists between ion beam 551 paths and the plurality of gate structures 85–87. During irradiation, ion beam 551 paths comprise two directional components, denoted by the solid arrows 401 and 410, while photoresist structures 88 and 89 provide shielding for gate sidewalls 91 and 92, respectively.

Figure 9:
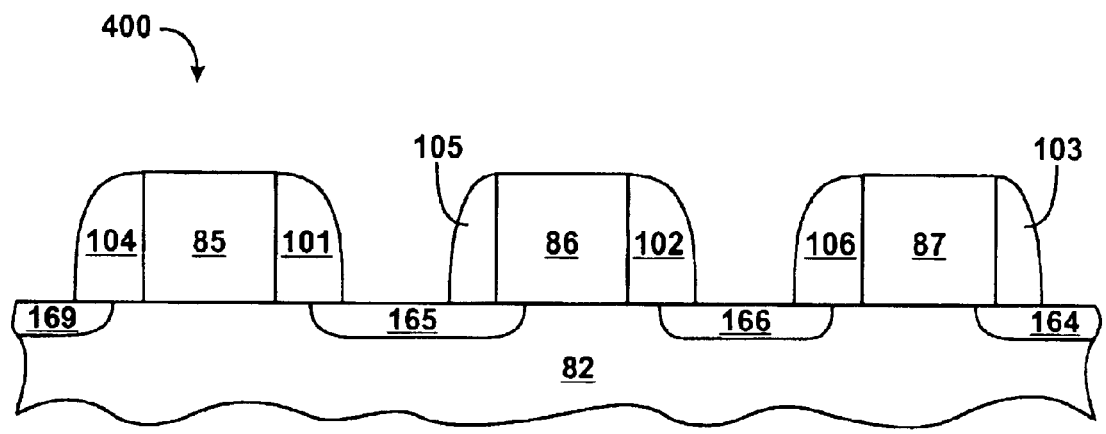

FIG. 9 illustrates a cross-sectional view of the portion 400 of the semiconductor device of FIG. 8 following photoresist strip and anisotropic etching of the sidewall layer 80. After delivery of a ion dose 551 and 555, which ranges from between $10^{12}$ to $10^{15}$ cm$^{-2}$, the photoresist structures 88 and 89 are stripped away, and portion 400 is subjected to an anisotropic etching process. The radiation damaged gate sidewall 93 (unprotected in FIG. 7) and 95, will etch at a faster rate than the protected gate structure sidewalls 91, 92, 94, and 96. This results in the formation of an asymmetric spacers 104 and 101 on gate structure 85; asymmetric spacers 105 and 102 on gate structure 86, and asymmetric spacers 106 and 103 on gate structure 87, as shown in FIG. 8.

Following the anisotropic etch process, a dopant is implanted to form a source and/or drain extension areas such as 164, 166, 165, and 169. Due to the asymmetric nature of the sidewalls for gate structure 85 and 86, the source extension area 165 underlies the gate structure 86 by an amount greater than the drain extension area 166 underlies gate structure 86. Because of the placement of photoresist structure 89 during the previous substantially non-orthogonal ion beam exposure, a common drain extension area 166 is created between gate structure 86 and 87. The implantation dopant can comprise a number of materials, such as boron (B), arsenic (As), phosphorus (P), boron-diflouride (Bf$_2$).

As seen in FIGS. 7 and 8, on a wafer containing a plurality of gate structures, there were two mask and etch processes which lead to the formation of the device of FIG. 9. There can be, however, numerous other design possibilities driving the placement and number of mask structures and etches than those of the examples of FIGS. 7–9. One could perform additional mask, irradiation, and etch steps according to the design needs of a particular application.

Figure 10:
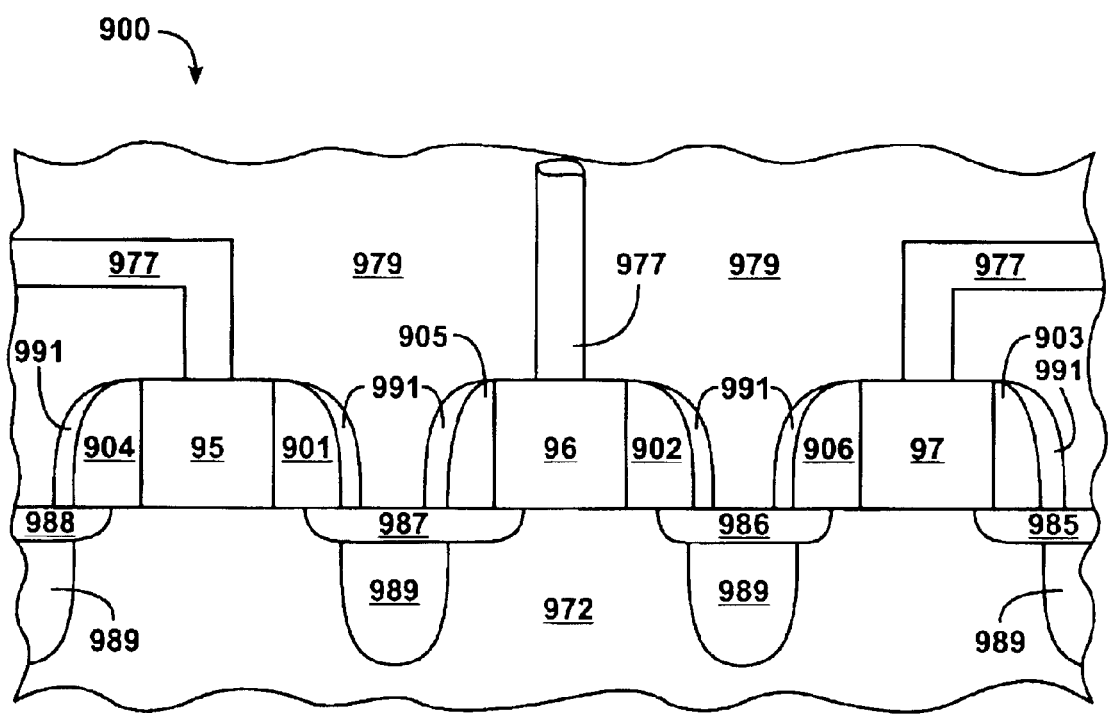

FIG. 10 is a cross-sectional illustration of a portion 900 of a semiconductor device manufactured according to an embodiment of the present disclosure. The simplified diagram which does not show all of the features of portion 900 in order to keep the illustration from being cluttered. However, source and/or drain extension regions 985–988 within substrate 912, secondary spacers 991, used to define deep source drain implants 909, and interconnects 977 within a dielectric layer 979, are shown. It should be noted that although the example presented in FIG. 9 shows that the spacers 901–906 and 991 have been left in place adjoining their respective gates 95, 96, and 97, in other embodiments these spacers 901–906 can be removed in subsequent processing steps, if not required. Source and drain areas, which would be created in subsequent deep implantation process steps, are not illustrated in FIG. 10.

In an embodiment of the present disclosure, a first plurality of gate structures, each having first and second opposing sidewalls facing approximately opposite directions is formed. The first sidewalls face a first direction, such as 94, 95, and 96 in FIG. 7, while the second sidewalls face a second direction, such as 91, 92, and 93 in FIG. 7. A spacer layer is formed overlying the plurality of gate structures, and any desired photoresist mask structures selectively formed. An ion beam will be used to dose the spacer layer. Prior to irradiation, a tilt is adjusted between the ion beam path and the plurality of gate structures to comprise a directional component in the second direction. The first sidewalls of a second plurality of gate structures are subjected to a first ion dose. The second plurality of gate structures is a subset of the first plurality of gate structures that has less than the first plurality of gate structures. In an embodiment, the second sidewall of a third plurality of gate structures is subjected to a second ion dose. The third plurality of gate structures a subset of the first plurality of gate structures that has that is less than the first plurality of gate structures.

In a further embodiment, the third plurality of gate structures are substantially mutually exclusive to the second plurality of gate structures. That is, substantially mutually exclusive indicates that the first plurality of gates has less than 50 percent of members in common with the second plurality of gates. In another embodiment, substantially mutually exclusive indicates that the first plurality of gates has less than 10 percent of members in common with the second plurality of gates. In a further embodiment, substantially mutually exclusive indicates that the first plurality of gates has less than 1 percent of members in common with the second plurality of gates.

Following irradiation, a first portion of the spacer layer overlying the first sidewall is anisotropically etched to form a spacer on the first side, and a second portion of the spacer layer overlying the second sidewall is anisotropically etched to form a spacer on the second sidewall. A dopant is then implanted to form a source extension area adjoining the first sidewall and a drain extension area adjoining the second sidewall. The source extension area underlies the gate structure by an amount greater than the drain extension area, as seen, for example, in extension area 987 in FIG. 10.

The method and apparatus herein provides for a flexible implementation. Although the invention has been described using certain specific examples, it will be apparent to those skilled in the art that the invention is not limited to these few examples. For example, the disclosure is discussed herein primarily with regard to asymmetric spacer formation for a CMOS device, however, the invention can be employed with other device technologies to create asymmetric spacers during device manufacture. In addition, it will be appreciated that instead of bombarding sidewalls to enhance their etch rates, they may be hardened to reduce their etch rates. For example, nitrogen can be implanted within selective sidewalls. Additionally, various types of deposition and etch techniques and devices are currently available which could be suitable for use in employing the method as taught herein. Note also, that although an embodiment of the present invention has been shown and described in detail herein, along with certain variants thereof, many other varied embodiments that incorporate the teachings of the invention may be easily constructed by those skilled in the art. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method comprising:

forming a gate structure on a semiconductor substrate;

forming a sidewall layer overlying the gate structure and the semiconductor substrate, wherein the sidewall layer comprises a first portion overlying a first sidewall of the gate structure;

forming a photoresist structure adjacent to the first portion; and subjecting the photoresist structure to an ion beam, wherein the photoresist structure shields at least part of the first portion from the ion beam.

2. The method of claim 1, wherein the step of subjecting comprises orienting the first sidewall to have a non-orthogonal tilt angle between a path of the ion beam and a surface of the first sidewall.

3. The method of claim 2, wherein subjecting further comprises the non-orthogonal tilt angle having an angle of incidence formed by the path of the ion beam and the surface of the first sidewall ranging between 7 degrees and 45 degrees.

4. The method of claim 2, wherein subjecting further comprises selecting the non-orthogonal tilt angle based upon a thickness of the sidewall layer and a height of the gate structure.

5. The method of claim 4, wherein subjecting further comprises selecting the non-orthogonal tilt angle based upon a height of the photoresist structure.

6. The method of claim 1, wherein subjecting further comprises the ion beam delivering a dose ranging from between $10^{12}$ to $10^{15}$ cm$^{-2}$.

7. The method of claim 1, wherein subjecting further comprises the ion beam comprises a species of an element with an atomic number greater than 9.

8. The method of claim 7, wherein subjecting further comprises the ion beam comprises an element selected from the group consisting of silicon, germanium, and neon.

9. The method of claim 1, wherein subjecting further comprises the ion beam comprises a species of an element with an atomic number less than 9.

10. The method of claim 1, wherein forming a sidewall layer comprises the sidewall layer comprising a nitride.

11. The method of claim 1, wherein forming a sidewall layer comprises the sidewall layer comprising an oxide.

12. The method of claim 1, further comprising:

anisotropically etching a first portion of a sidewall layer to form a spacer on a first side, and implanting a dopant to form a source extension area on the first side and a drain extension area on a second side, wherein the source extension area underlies the gate structure by an amount greater than the drain extension area.

13. A method of forming a semiconductor device comprising:

forming a first gate structure having a first side facing a first direction, and a second side facing a second direction, wherein the first side and the second side are parallel to each other, and the first direction is substantially opposite the second direction;

forming a sidewall layer overlying the first gate structure, wherein the sidewall layer comprises a first sidewall layer portion overlying the first side, and a second sidewall layer portion overlying the second side; and subjecting the first sidewall layer portion to an ion dose while the second sidewall layer portion is not subjected to the ion dose.

14. The method of claim 12 comprising:

forming a second gate structure having a first side facing the first direction, and a second side facing the second direction;

forming the sidewall layer overlying the second gate structure, wherein the sidewall layer comprises a third sidewall layer portion overlying the first side of the second gate structure, and a fourth sidewall layer portion overlying the second side of the second gate structure; and shielding the third sidewall layer portion from the ion dose when the first side of the first gate is subjected to the ion dose.

15. The method of claim 12, further comprising:

anisotropically etching a first portion of the first sidewall layer portion overlying the first side to form a spacer on the first side;

anisotropically etching a second portion of the second sidewall layer portion overlying the second side to form a spacer on the second side; and implanting a dopant to form a source extension area adjoining the first side and a drain extension area adjoining the second side, wherein the source extension area underlies the gate structure by an amount greater than the drain extension area.

16. The method of claim 12, further comprising forming a photoresist structure adjacent to the first side.

17. The method of claim 12, further comprising forming a photoresist structure adjacent to the second side.

18. The method of claim 12, further comprising orienting a substantially horizontal surface of the gate structure to form a non-orthogonal angle of incidence between a path of an ion beam and the substantially horizontal surface of the gate structure.

19. The method of claim 17, wherein the non-orthogonal angle of incidence ranges between 7 degrees and 45 degrees.

20. The method of claim 17, wherein the non-orthogonal angle of incidence is based upon the thickness of the sidewall layer and a vertical dimension of a photoresist structure.

21. The method of claim 12, wherein the ion dose ranges from between $10^{12}$ to $10^{15}$ cm$^{-2}$.

22. The method of claim 12, further comprising etching the sidewall layer to form a spacer adjoining the first side having a first thickness and a spacer adjoining the second side having a second thickness.

23. A method of forming a semiconductor device comprising:

forming a first plurality of gate structures overlying a substrate, each of the first plurality of structures comprising a first side facing a first direction, and a second side facing a second direction, wherein the first direction and the second direction are approximately opposite directions;

forming a spacer layer overlying the plurality of gates;

adjusting a tilt between an ion beam path and the plurality of gate structures to comprise a directional component in the second direction;

subjecting the first side of a second plurality of gate structures to a first ion dose, wherein the second plurality of gate structures is a subset of the first plurality of gate structures that is less than the first plurality of gate structures.

24. The method of claim 22 further comprising:

subjecting the second side of a third plurality of gate structures to a second ion dose, wherein the third plurality of gate structures is a subset of the first plurality of gate structures that is less than the first plurality of gate structures.

25. The method of claim 23 wherein the third plurality of gate structures is substantially mutually exclusive to the second plurality of gate structures, wherein substantially mutually exclusive indicates that the first plurality of gates has less than 50 percent of members in common with the second plurality of gates.

26. The method of claim 23 wherein the third plurality of gate structures is substantially mutually exclusive to the second plurality of gate structures, wherein substantially mutually exclusive indicates that the first plurality of gates has less than 10 percent of members in common with the second plurality of gates.

27. The method of claim 23 wherein the third plurality of gate structures is substantially mutually exclusive to the second plurality of gate structures, wherein substantially mutually exclusive indicates that the first plurality of gates has less than 1 percent of members in common with the second plurality of gates.

28. The method of claim 22, further comprising:

anisotropically etching a first portion of the spacer layer overlying the first side to form a spacer on the first side;

anisotropically etching a second portion of the spacer layer overlying the second side to form a spacer on the second side; and implanting a dopant to form a source extension area adjoining the first side and a drain extension area adjoining the second side, wherein the source extension area underlies the gate structure by an amount greater than the drain extension area.

29. A method comprising:

forming a gate structure on a semiconductor substrate;

forming a sidewall layer overlying the gate structure and the semiconductor substrate, wherein the sidewall layer comprises a first portion overlying a first sidewall of the gate structure;

forming a photoresist structure adjacent to the first portion; and subjecting the photoresist structure to an ion beam, wherein the photoresist structure shields at least part of the first portion from the ion beam.

* * * * *